US011116112B2

(12) United States Patent
Merchant et al.

(10) Patent No.: US 11,116,112 B2
(45) Date of Patent: Sep. 7, 2021

(54) COLD ENERGY RECOVERY APPARATUS FOR A SELF-POWERED DATA CENTRE

(71) Applicant: Keppel Offshore & Marine Technology Centre Pte Ltd, Singapore (SG)

(72) Inventors: Aziz Amirali Merchant, Singapore (SG); Anis Altaf Hussain, Singapore (SG); Sreekala Kumar, Singapore (SG); Abul Bashar Md Masum Reza, Singapore (SG); Peter Francis Bernad Adaikalaraj, Singapore (SG); Jackson Tee, Singapore (SG)

(73) Assignee: KEPPEL OFFSHORE & MARINE TECHNOLOGY CENTRE PTE LTD, Singapore (SG)

( * ) Notice: Subject to any disclaimer, the term of this patent is extended or adjusted under 35 U.S.C. 154(b) by 0 days.

(21) Appl. No.: 16/640,136

(22) PCT Filed: Aug. 21, 2018

(86) PCT No.: PCT/SG2018/050423
§ 371 (c)(1),
(2) Date: Feb. 19, 2020

(87) PCT Pub. No.: WO2019/040001
PCT Pub. Date: Feb. 28, 2019

(65) Prior Publication Data
US 2020/0305313 A1    Sep. 24, 2020

(30) Foreign Application Priority Data

Aug. 23, 2017  (SG) .............................. 10201706878P

(51) Int. Cl.
*H05K 7/20* (2006.01)
*H05K 7/14* (2006.01)
(Continued)

(52) U.S. Cl.
CPC ......... *H05K 7/20745* (2013.01); *B63B 25/16* (2013.01); *B63B 35/44* (2013.01);
(Continued)

(58) Field of Classification Search
CPC ......... H02S 10/12; H02S 10/40; B63B 25/16; B63B 35/44; F17C 7/04; F17C 2223/0161;
(Continued)

(56) References Cited

U.S. PATENT DOCUMENTS

| 4,036,028 A | 7/1977 | Mandrin |
| 10,330,262 B2 * | 6/2019 | Mao .......................... F17C 7/04 |

(Continued)

FOREIGN PATENT DOCUMENTS

| CN | 205669675 | 11/2016 |
| DE | 3626359 | 2/1988 |

(Continued)

OTHER PUBLICATIONS

International Search Report and Written Opinion issued in PCT/SG2018/050423, dated May 8, 2019.
(Continued)

*Primary Examiner* — Zachary Pape
(74) *Attorney, Agent, or Firm* — BakerHostetler

(57) ABSTRACT

A cold energy recovery apparatus for a self-powered data centre is disclosed. The apparatus comprises a fluid storage tank having at least a pair of inlet and outlet, the inlet configured to receive a coolant; and a heat exchanger arranged in the tank, the heat exchanger having a pair of inlet and outlet, the inlet configured to receive liquefied natural gas. The apparatus is operable to permit the coolant to flow from the inlet to the outlet of the tank causing the coolant to be in fluid contact with the heat exchanger, in which the coolant is progressively cooled to a lower temperature by
(Continued)

heat transfer to the liquefied natural gas via fluid contact with the heat exchanger. The liquefied natural gas is vaporized into natural gas due to the heat transfer and is directed out from the outlet of the heat exchanger.

5 Claims, 11 Drawing Sheets

(51) Int. Cl.
| | | |
|---|---|---|
| *F17C 9/04* | (2006.01) | |
| *F28D 21/00* | (2006.01) | |
| *H02S 10/12* | (2014.01) | |
| *H02S 10/40* | (2014.01) | |
| *B63B 25/16* | (2006.01) | |
| *B63B 35/44* | (2006.01) | |
| *F17C 7/04* | (2006.01) | |
| *H02K 7/18* | (2006.01) | |
| *F03D 13/25* | (2016.01) | |
| *F03B 13/26* | (2006.01) | |

(52) U.S. Cl.
CPC ............ *F17C 7/04* (2013.01); *F28D 21/0001* (2013.01); *H02K 7/1815* (2013.01); *H02S 10/12* (2014.12); *H02S 10/40* (2014.12); *H05K 7/1497* (2013.01); *H05K 7/2079* (2013.01); *H05K 7/20327* (2013.01); *F03B 13/26* (2013.01); *F03D 13/25* (2016.05); *F17C 9/04* (2013.01); *F17C 2223/0161* (2013.01); *F17C 2227/0318* (2013.01); *F17C 2227/0327* (2013.01); *Y02E 10/50* (2013.01)

(58) Field of Classification Search
CPC ...... F17C 2227/0318; F17C 2227/0327; F03D 13/25; F03B 13/26; F22B 1/16
See application file for complete search history.

(56) References Cited

U.S. PATENT DOCUMENTS

| | | | |
|---|---|---|---|
| 10,532,795 B2 * | 1/2020 | Laird | ............... B63B 25/16 |
| 2008/0047280 A1 | 2/2008 | Dubar | |
| 2009/0211263 A1 | 8/2009 | Coyle | |
| 2013/0025827 A1 * | 1/2013 | Su | ............... H05K 7/20745 |
| | | | 165/104.25 |
| 2013/0031924 A1 * | 2/2013 | Su | ............... H05K 7/2079 |
| | | | 62/259.2 |
| 2018/0376622 A1 * | 12/2018 | Mao | ............... H05K 7/20745 |

FOREIGN PATENT DOCUMENTS

| | | | | |
|---|---|---|---|---|
| JP | 2010267707 A | * | 11/2010 | ......... H05K 7/20836 |
| WO | WO-2013130557 A1 | * | 9/2013 | ............. F01K 25/10 |

OTHER PUBLICATIONS

International Preliminary Report on Patentability issued in PCT/SG2018/050423, dated Oct. 28, 2019.

* cited by examiner

COLD ENERGY RECOVERY APPARATUS FOR A SELF-POWERED DATA CENTRE

FIELD

The present invention relates to a cold energy recovery apparatus for a self-powered data centre.

BACKGROUND

Conventionally, data centres tend to utilise massive amounts of water to cool IT equipment that are installed within the data centres, which thereby result in wastage of a precious natural resource at an alarming rate. For information, it is highlighted that an average-size data centre consumes enough water for cooling to supply about 2000 homes a year. As it may be appreciated, this model of cooling data centres is not sustainable in the long term as requirements for large data centres are growing steadily A solution to the mentioned problem is to set up data centres that leverage on using natural water resources (e.g. seawater) to control thermal conditions within the data centres, and in this way, there is no wastage of the water resources, as waters (used for cooling) are drawn from and returned to natural sources at the pre-usage and post-usage stages of the cooling. With this solution however, the challenge then turns to implementing various energy/power efficient technologies to reduce power consumption of the data centres. In this respect, a related report released in 2016 has found that data centres consume about 3% of the global electricity supply. Typically, energy usage distribution in a data centre can be broken down as: 51%, 37% and 12% of the energy usage being respectively attributable to energy spending incurred by IT load, mechanical systems and electrical system losses of the data centre. Needless to say, cooling expenses will be an important factor in operation of data centres, and so bringing down power usage effectiveness is highly desirable.

One object of the present invention is therefore to address at least one of the problems of the prior art and/or to provide a choice that is useful in the art.

SUMMARY

According to a $1^{st}$ aspect of the invention, there is provided a cold energy recovery apparatus for a self-powered data centre, the apparatus comprising: a fluid storage tank having at least a pair of inlet and outlet, the inlet configured to receive a coolant; and a heat exchanger arranged in the tank, the heat exchanger having a pair of inlet and outlet, the inlet configured to receive liquefied natural gas. The apparatus is operable to permit the coolant to flow from the inlet to the outlet of the tank causing the coolant to be in fluid contact with the heat exchanger, in which the coolant is progressively cooled to a lower temperature by heat transfer to the liquefied natural gas via fluid contact with the heat exchanger. The liquefied natural gas is vaporized into natural gas due to the heat transfer and is directed out from the outlet of the heat exchanger.

Advantageously, the proposed apparatus is configured to recover cold energy stored in the liquefied natural gas (LNG) by a coolant that can subsequently be used for cooling systems applications, such as in data centres that may require continuous removal of heat (generated by components installed within the data centres) for smooth operations thereof. Importantly, the natural gas (NG) produced may be used by gas engines to generate electricity, which is in turn used to power the data centres. Hence, this allows the data centres to be self-powered, without being reliant on electrical grids for powering purposes.

Preferably, the coolant may include but not limited to water, glycol water, a phase change material, or an anti-freeze solution.

Preferably, the inlet and outlet of the tank may be arranged at respective portions of the tank, in which the respective portions are of different elevations.

More preferably, the inlet and the outlet of the tank may respectively be arranged at a lower portion and an upper portion of the tank.

Preferably, the inlet and outlet of the heat exchanger may be coupled to a liquefied natural gas regasification device, which is arranged to provide the flow of liquefied natural gas to the inlet, and to receive the natural gas from the outlet.

Preferably, the natural gas may be provided to a gas engine for power generation.

Preferably, the inlet and outlet of the tank may be coupled to at least one data centre, which is arranged to provide and receive the flow of the coolant to and from the inlet and outlet respectively.

Preferably, the coolant provided to the inlet of the tank may have been heated from cooling computing equipment in the data centre.

Preferably, the heat exchanger may be arranged to be in the form of a plurality of fluid conduits.

Preferably, the apparatus may be configured to be operable with a floating data centre.

More preferably, the floating data centre may be configured to be arranged on a vessel.

According to a $2^{nd}$ aspect of the invention, there is provided a method of cooling a coolant using a cold energy recovery apparatus for a self-powered data centre, the apparatus includes a fluid storage tank having at least a pair of inlet and outlet, and a heat exchanger arranged within the tank, the heat exchanger having a pair of inlet and outlet. The method comprises: receiving the coolant from the inlet of the tank; and receiving liquefied natural gas from the inlet of the heat exchanger, wherein the coolant is permitted by the apparatus to flow from the inlet to the outlet of the tank causing the coolant to be in fluid contact with the heat exchanger, in which the coolant is progressively cooled to a lower temperature by heat transfer to the liquefied natural gas via fluid contact with the heat exchanger. The liquefied natural gas is vaporized into natural gas due to the heat transfer and is directed out from the outlet of the heat exchanger.

Preferably, the coolant may include water, glycol water, a phase change material, or an anti-freeze solution.

According to a $3^{rd}$ aspect of the invention, there is provided a self-powered data centre comprising: a plurality of computing units; a plurality of air handling units configured to use chilled water to provide cooling to the computing units, in which the chilled water is converted to heated water during the cooling; the cold energy recovery apparatus of any of claims 1-9 configured to receive the heated water from the air handling units and to cool the heated water to produce cooled water; a plurality of liquefied natural gas tanks coupled to the cold energy recovery apparatus to provide liquefied natural gas thereto for cooling the heated water; a plurality of vapour compression chillers configured to receive the cooled water from the cold energy recovery apparatus and to further cool the cooled water using seawater to produce chilled water for provision to the air handling units; a plurality of vapour absorption chillers configured to use waste heat energy and seawater to produce chilled water for provision to the air handling units; a plurality of gas engine generators configured to receive natural gas from the cold energy recovery apparatus for power generation, the power generated provided to operate the computing units; a plurality of waste heat recovery units coupled to the gas engine generators to recover waste heat energy generated by the gas engine generators during power generation, the waste heat energy provided to the vapour absorption chillers; and an integrated power and water management system configured to be electrically coupled to the vapour compression chillers, the vapour absorption chillers, the gas engine generators, and the computing units to enable power and cooling management thereof.

Preferably, the data centre may be configured to be a floating data centre, or arranged to be proximate to a body of water.

Preferably, the data centre may be configured to be arranged on a vessel.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIG. 1a shows a cold energy recovery apparatus for a self-powered data centre, according to an embodiment.

FIG. 1b shows a process for operating the apparatus of FIG. 1a.

FIG. 2 shows schematics of a self-powered data centre which deploys the apparatus of FIG. 1a.

FIG. 3 shows a scenario which the apparatus of FIG. 1a is deployable in.

FIG. 8 shows a side view of a floating data centre, which uses the apparatus of FIG. 1a.

DETAILED DESCRIPTION OF PREFERRED EMBODIMENTS

Figure 1:
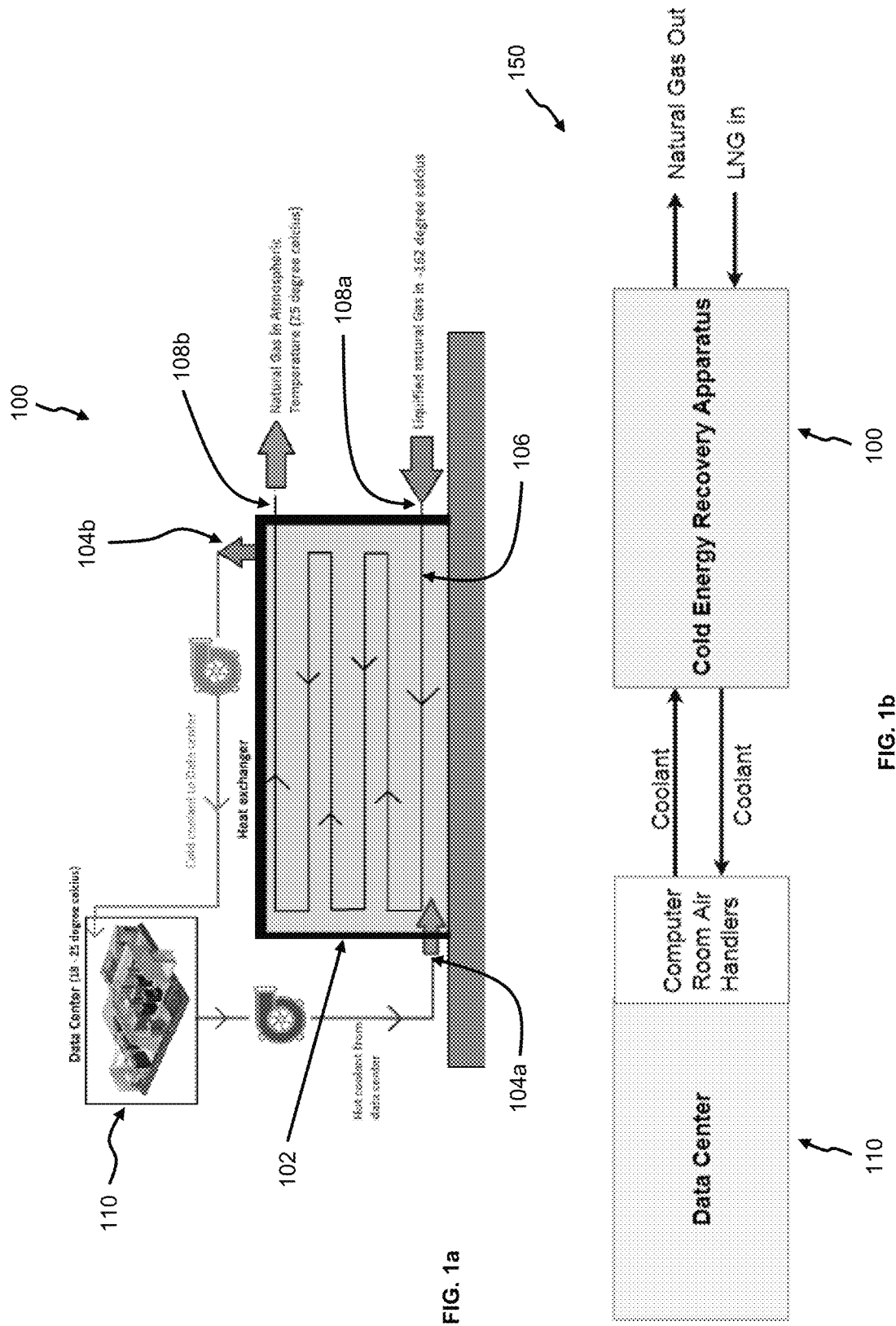

With reference to FIG. 1a, a cold energy recovery apparatus 100 (for a self-powered data centre) is disclosed. Broadly, the apparatus 100 comprises: a fluid storage tank 102 having at least a pair of inlet 104a and outlet 104b, the inlet 104a configured to receive a coolant; and a heat exchanger 106 arranged in the tank 102, the heat exchanger 106 having a pair of inlet 108a and outlet 108b, the inlet 108a configured to receive liquefied natural gas (LNG). The apparatus 100 is operable to permit the coolant to flow from the inlet 104a to the outlet 104b of the tank 102 causing the coolant to be in fluid contact with the heat exchanger 106, in which the coolant is progressively cooled to a lower temperature by heat transfer to the liquefied natural gas via fluid contact with the heat exchanger 106. In other words, the heat exchanger 106 is completely submerged in the coolant introduced into the tank 102 to enable efficient heat transfer to take place via the fluid contact. The liquefied natural gas is consequently vaporized into natural gas due to the heat transfer and is then directed out from the outlet 108b of the heat exchanger 106. FIG. 1b shows a process 150 for operating the apparatus 100. It is to be appreciated that the coolant may include water, glycol water, a phase change material, an anti-freeze solution or any other suitable fluids known in the art. Moreover, the apparatus 100 may also be known as an LNG-based chiller, since the apparatus 100 uses LNG for cooling the coolant.

Further, the inlet 104a and outlet 104b of the tank 102 are coupled to at least one data centre 110, which is arranged to provide and receive the flow of the coolant to and from the inlet 104a and outlet 104b respectively. That means to say, the tank 102 can be arranged to receive coolant from multiple data centres, if necessary, depending on a configured capacity of the tank 102. More specifically, the data centre 110 uses the coolant to cool computer systems (and associated components) that are housed within the data centre 110. Needless to say, the coolant provided to the inlet 104a of the tank 102 is thus already heated, having being used to cool the computer systems, while the coolant supplied to the data centre 110 from the outlet 104 of the tank 102 has been cooled by the heat exchanger 106. Hence, transfer of the coolant from the data centre 110 to the apparatus 100, and from the apparatus 100 back to the data centre 110 forms a closed-loop system.

Broadly, the coolant provided to the inlet 104a of the tank 102 is of a first temperature, while the coolant exiting the outlet 104b of the tank 102 is of a second temperature, where the second temperature is lower than the first temperature. More specifically, it is to be appreciated that as the liquefied natural gas is circulated through the heat exchanger 106, the liquefied natural gas is warmed by the coolant (having the first temperature) entering from the inlet 104a of the tank 102. Simultaneously, as the liquefied natural gas is being warmed, the coolant is cooled by the heat transfer occurring. Gradually, as the liquefied natural gas passes through the heat exchanger 106 (from the inlet 108a to the outlet 108b), the liquefied natural gas heats up and is converted into natural gas. Simultaneously, as the liquefied natural gas is being warmed, the coolant is then cooled from the first temperature to the second temperature. Without being construed as limiting, it is also useful to note that the coolant is in liquid form and stays in liquid form even at low temperatures, i.e. −162° C.

Then, the inlet 108a and outlet 108b of the heat exchanger 106 are coupled to a liquefied natural gas regasification device, which is arranged to provide the flow of liquefied natural gas to the inlet 108a, and to receive the natural gas from the outlet 108b. In one example, the heat exchanger 106 is arranged to be in the form of a plurality of fluid conduits, which are arranged to volumetrically be distributed in the tank 102, in order to ensure that the coolant flowing within the tank 102 are substantially in fluid contact with the heat exchanger 102 for efficient cooling of the coolant, as the coolant is directed to flow from the inlet to the outlet of the tank 102.

Also, the inlet 104a and outlet 104b of the tank 102 are arranged at respective portions of the tank 102, in which the respective portions are of different elevations. In one example (but not to be construed as limiting), the inlet 104a is positioned at the lower portion of the tank 102, whereas the outlet 104b is positioned at the upper portion of the tank 102, as illustrated in FIG. 1a. More specifically, in FIG. 1a, the inlet 104 is positioned at the bottom of the tank 102 so that when the heated coolant is introduced into the tank 102, the heated coolant may then push any cooled coolant resting on the bottom of the tank 102 away from the lower portion of the heat exchanger 106. This arrangement thus ensures that the cooled coolant does not freeze at the bottom of the tank 102, which is undesirable. The heat exchanger 106 can also be arranged with horizontal orientation.

FIG. 1b shows a process for operating the apparatus 100, where water is used as the coolant as an example. For good order, a method of cooling a coolant using the cold energy recovery apparatus 100 comprises: receiving the coolant from the inlet 104a of the tank 102; and receiving liquefied natural gas from the inlet 108a of the heat exchanger 106, wherein the coolant is permitted by the apparatus 100 to flow from the inlet 104a to the outlet 104b of the tank 102 causing the coolant to be in fluid contact with the heat exchanger 106, in which the coolant is progressively cooled to a lower temperature by heat transfer to the liquefied natural gas via fluid contact with the heat exchanger 106. The liquefied natural gas is vaporized into natural gas due to the heat transfer and is directed out from the outlet 108b of the heat exchanger 106.

Figure 2:
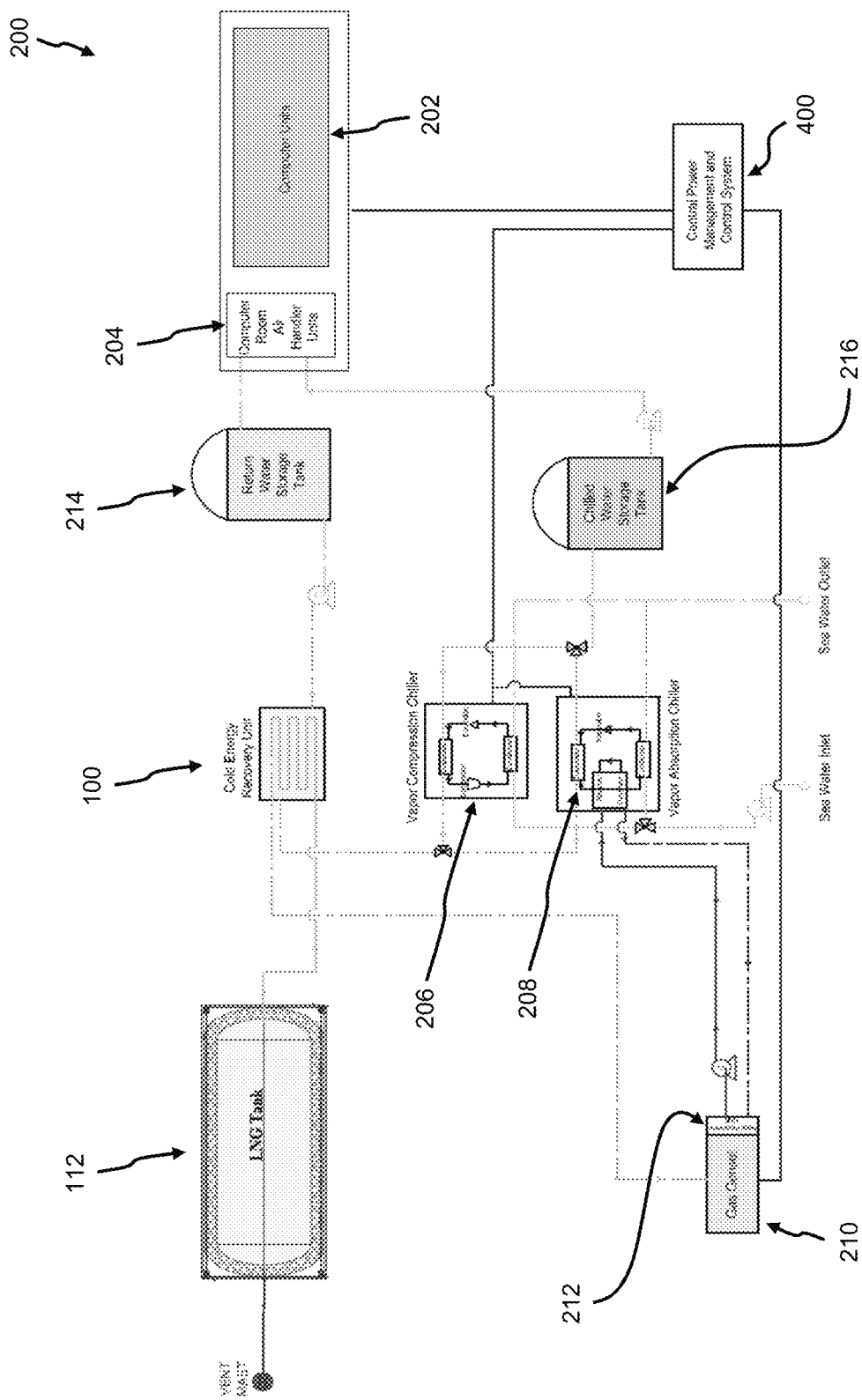

FIG. 2 shows schematics of a self-powered data centre 200, in which the apparatus 100 is deployed. To simplify illustration, it is highlighted that only one of each component of the self-powered data centre 200 is shown in FIG. 2, but should in no manner be construed as limiting. More specifically, the self-powered data centre 200 beneficially does not need to rely on the electrical grid for powering operations of the data centre (i.e. grid-independent for powering purposes). The self-powered data centre 200 may be configured to be a floating data centre (e.g. deployed offshore at sea), or arranged to be proximate to a body of water. Also, the data centre may be located on-board a vessel.

Broadly, the self-powered data centre 200 comprises: a plurality of computing units 202; a plurality of air handling units 204 (in a computer room) configured to use chilled water to provide cooling to the computing units 202, in which the chilled water is converted to heated water during the cooling; the cold energy recovery apparatus 100 configured to receive the heated water from the air handling units 204 and to cool the heated water to produce cooled water; a plurality of liquefied natural gas tanks 112 coupled to the cold energy recovery apparatus 100 to provide liquefied natural gas thereto for cooling the heated water; a plurality of vapour compression chillers 206 configured to receive the cooled water from the cold energy recovery apparatus 100 and to further cool the cooled water using seawater to produce chilled water for provision to the air handling units 204; a plurality of vapour absorption chillers 208 configured to use waste heat energy and seawater to produce chilled water for provision to the air handling units 204; a plurality of gas engine generators 210 configured to receive natural gas from the cold energy recovery apparatus 100 for power generation, the power generated provided to operate the computing units 202; a plurality of waste heat recovery units 212 coupled to the gas engine generators 210 to recover waste heat energy generated by the gas engine generators 210 during power generation, the waste heat energy provided to the vapour absorption chillers 208; and an Integrated Power and Water Management System (IPWMS) 400 configured to be electrically coupled to the vapour compression chillers 206, the vapour absorption chillers 208, the gas engine generators 210, and the computing units 202 to enable power and cooling management thereof. The IPWMS 400 will be elaborated later with reference to FIGS. 4a to 4d.

It is also to be appreciated that the heated water generated by the air handling units 204 may first be temporarily stored in a return water storage tank 214, before being provided to the cold energy recovery apparatus 100. Similarly, the chilled water generated by the vapour compression chillers 206, and the vapour absorption chillers 208 may first be temporarily stored in a chilled water storage tank 216, prior to being provided to the air handling units 204.

Figure 3:
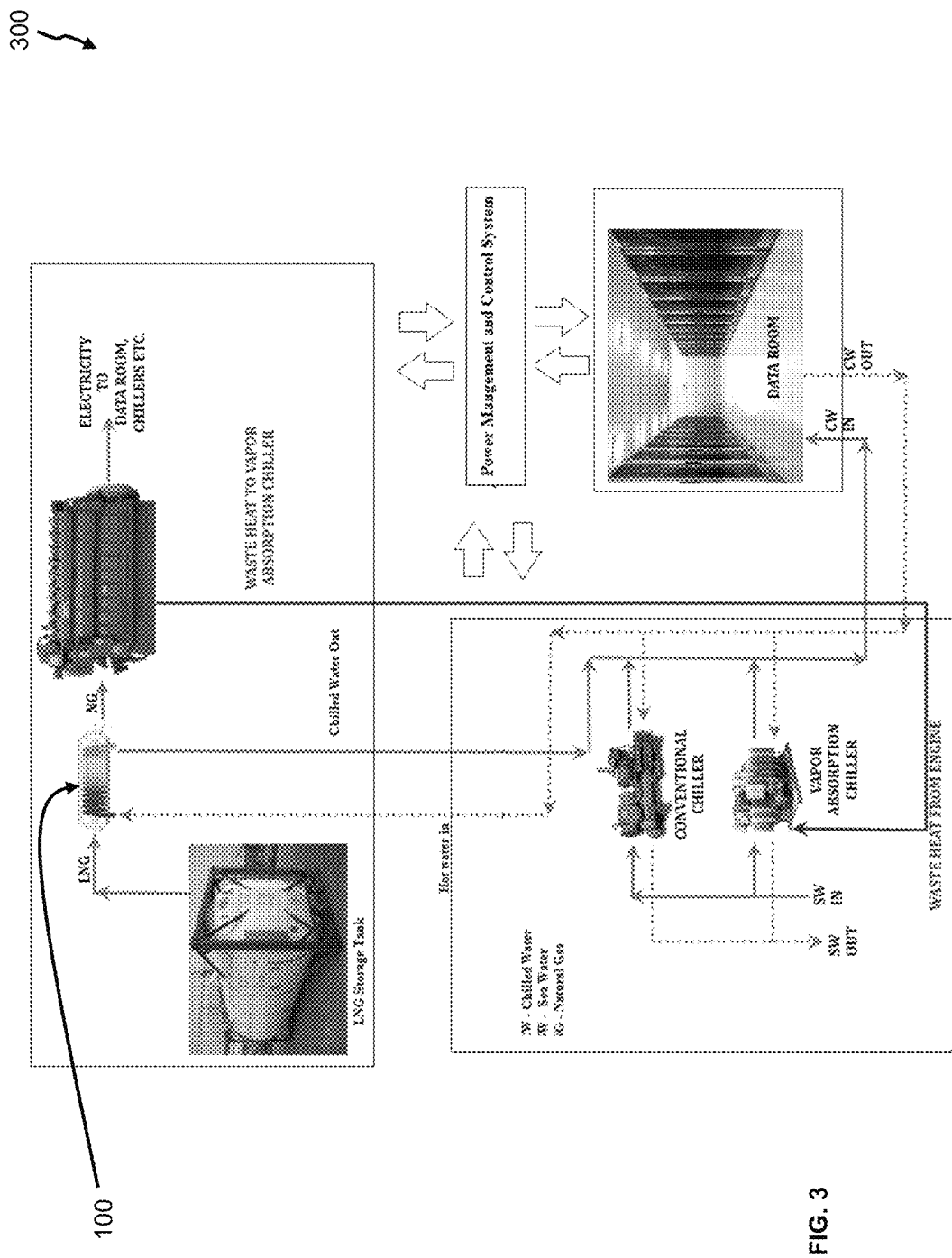
Figure 4A:
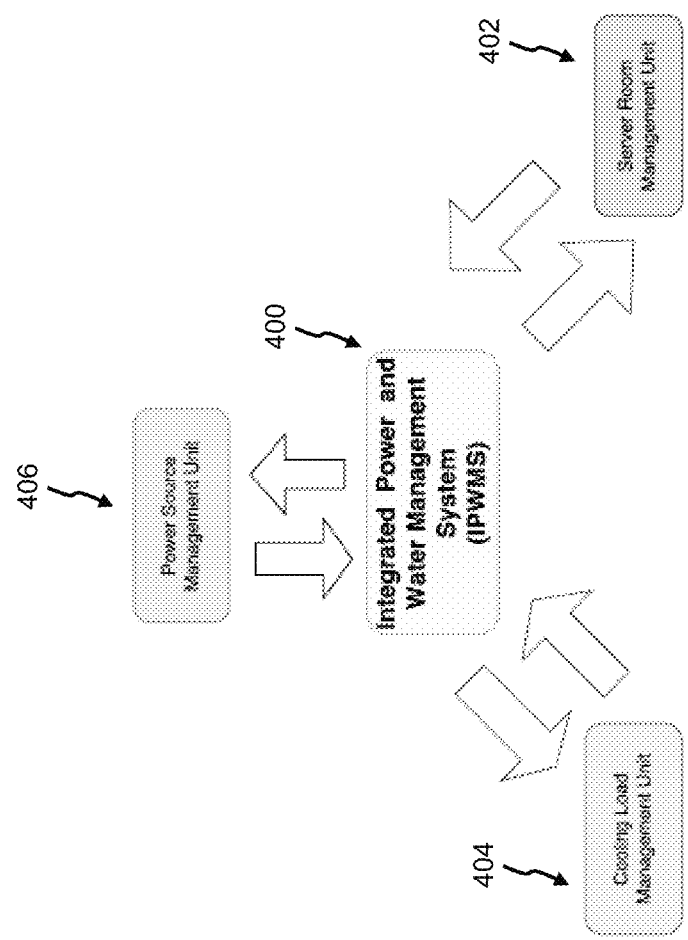
FIGS. 4a to 4d show schematics of an Integrated Power and Water Management System (IPWMS).
Figure 4B:
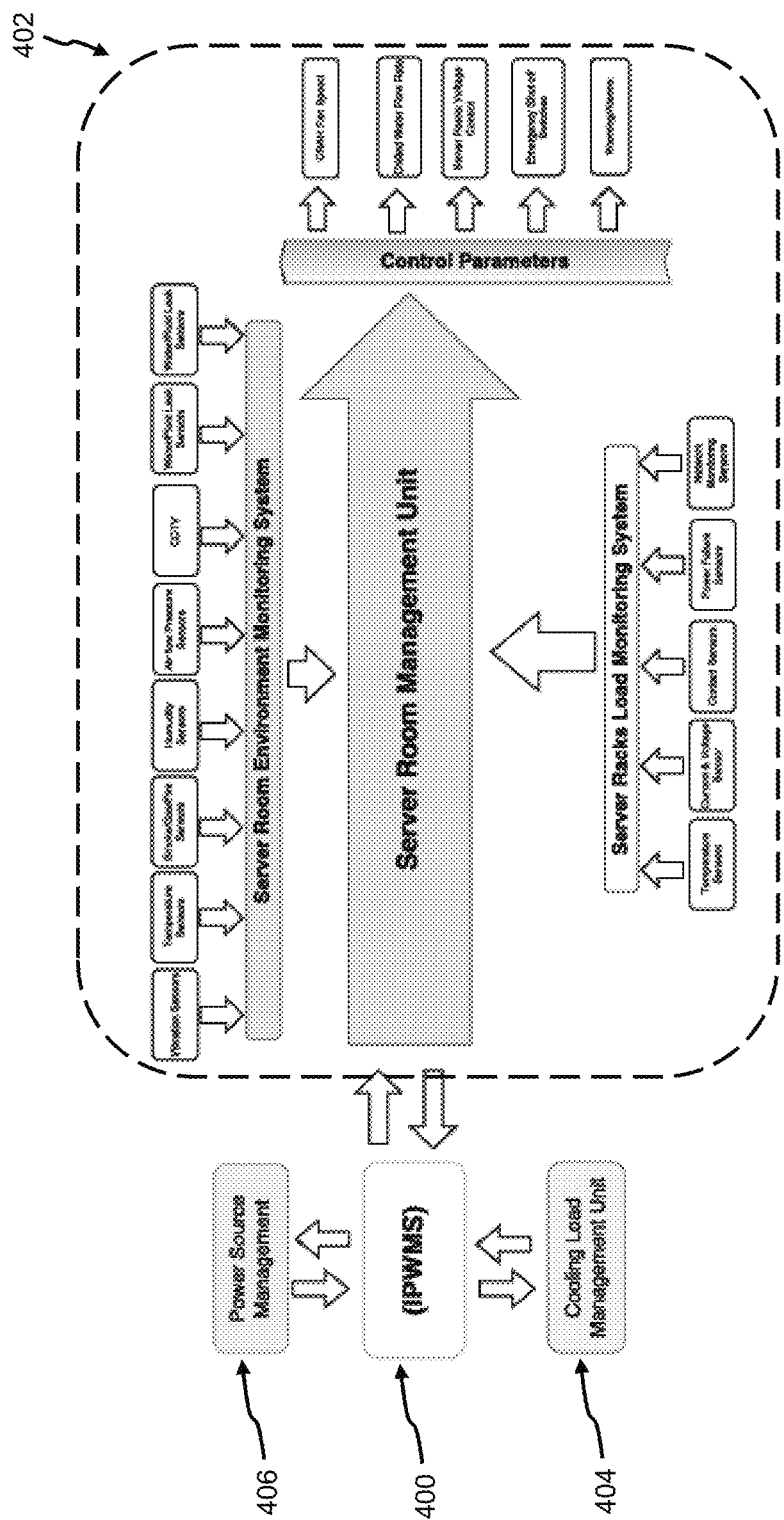
Figure 4C:
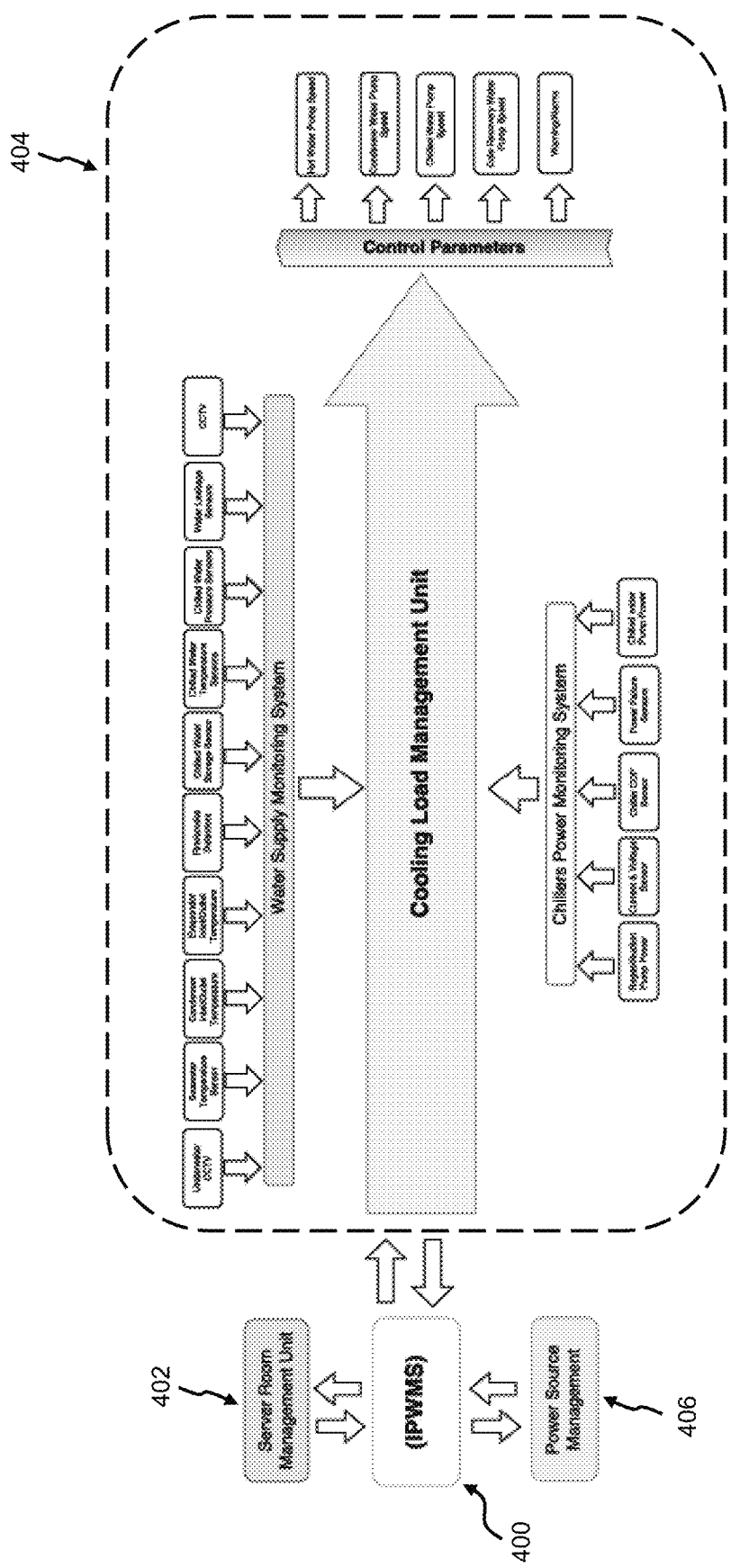
Figure 4D:
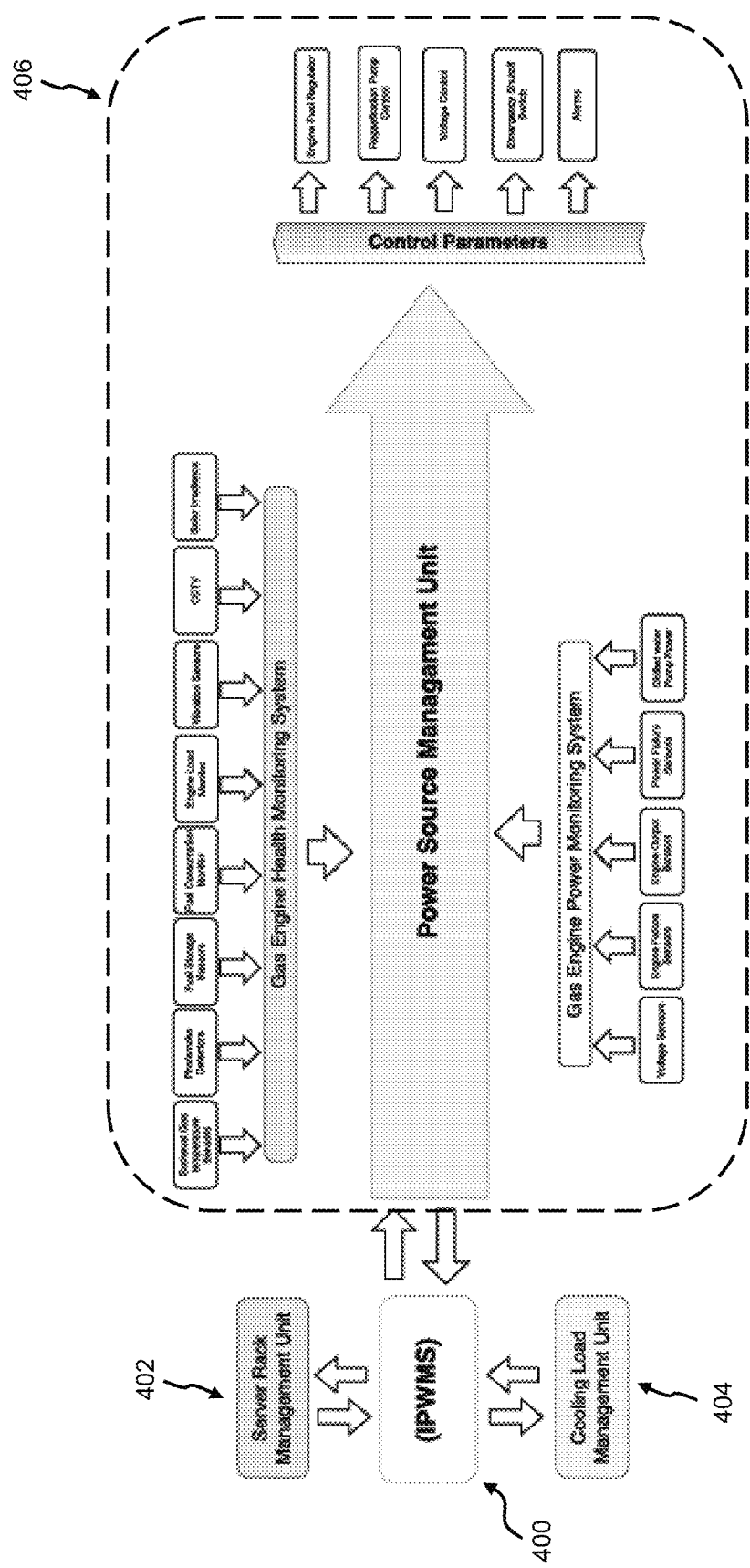

In an example, the temperature of the water entering the inlet 104a of the tank 102 (of the apparatus 100) is about 17° C., while the temperature of the water exiting the outlet 104b of the tank 102 (of the apparatus 100) is then about 12° C., i.e. the water has been cooled by about 5° C. FIG. 3 shows a scenario 300 which the apparatus 100 is deployable in. For the disclosed scenario 300, the natural gas obtained from using the apparatus 100 are fed to gas engine(s) for power generation, and the resulting electricity generated are in turn used to power the computer systems and/or associated components in the data centres.

Then, in a further example, the apparatus 100 is configured to be operable with a floating data centre (not shown), and thereby enable said data centre to be self-powered without need to tap into and be reliant on the electrical grid (i.e. grid-independent for powering purposes). The floating data centre may be configured to be arranged on a vessel, or alternatively, the floating data centre may be configured to have buoyancy capabilities by itself.

FIGS. 4a to 4d show schematics of the Integrated Power and Water Management System (IPWMS) 400 for management of data centres. Briefly, the IPWMS 400 is digitally coupled to three other separate management units: a Server Room Management Unit 402, a Cooling Load Management Unit 404, and a Power Source Management Unit 402. Each management unit 402, 404, 406 is configured to functionally control and monitor different operational aspects of the data centres. More specifically, the Cooling Load Management Unit 404 is used in conjunction with the apparatus 100 to ensure that cooling systems of the data centres are operating optimally, correctly and normally.

Further embodiments of the invention will be described hereinafter. For the sake of brevity, description of like elements, functionalities and operations that are common between the embodiments are not repeated; reference will instead be made to similar parts of the relevant embodiment(s).

Figure 5:
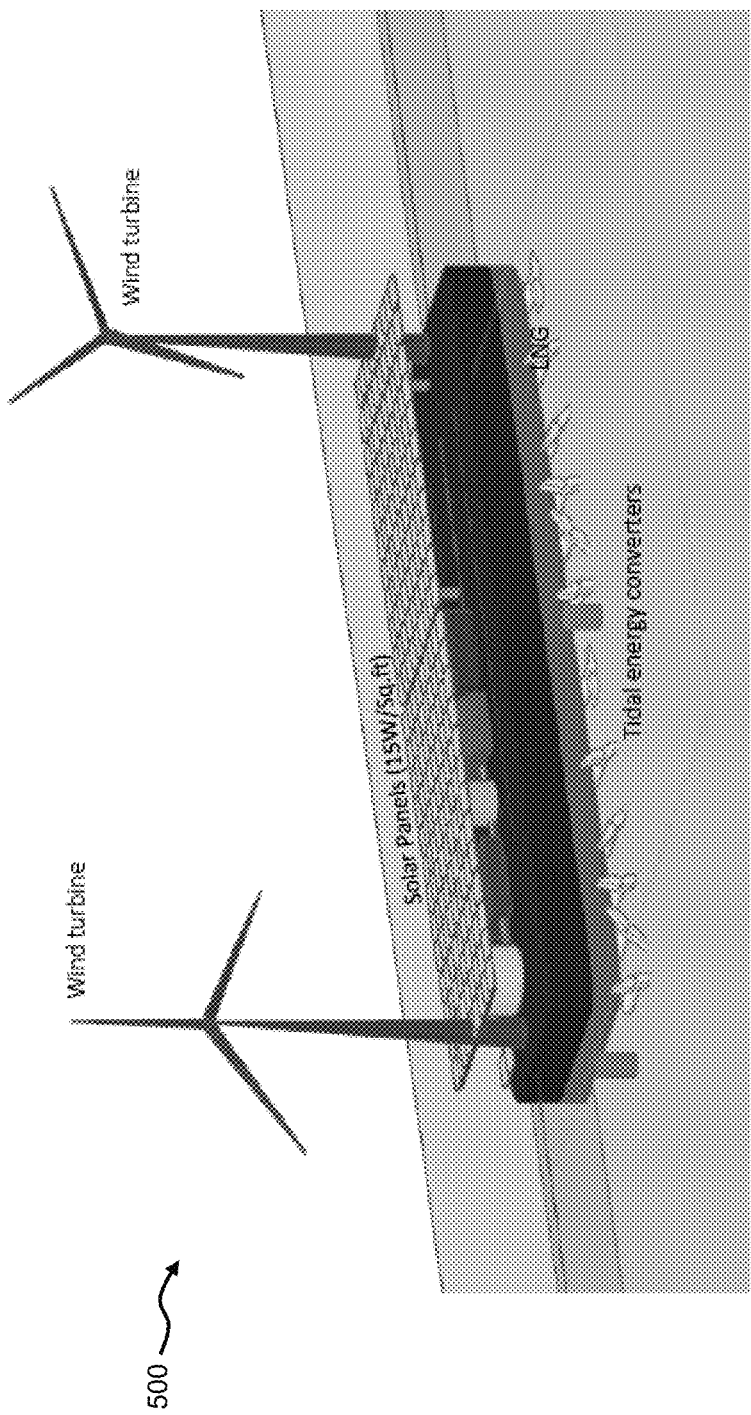
FIG. 5 shows a configuration in which wind turbines, solar panels and tidal turbines are installed on a floating data centre for electrical power generation to power the data centre.

Then, FIG. 5 shows a configuration 500 in which wind turbines, solar panels and tidal turbines are installed on a floating data centre for electrical power generation (i.e. green energy generation) to power the data centre. The configuration 500 is an application of utilising cold energy recovery for cooling offshore data centres.

Figure 6B:
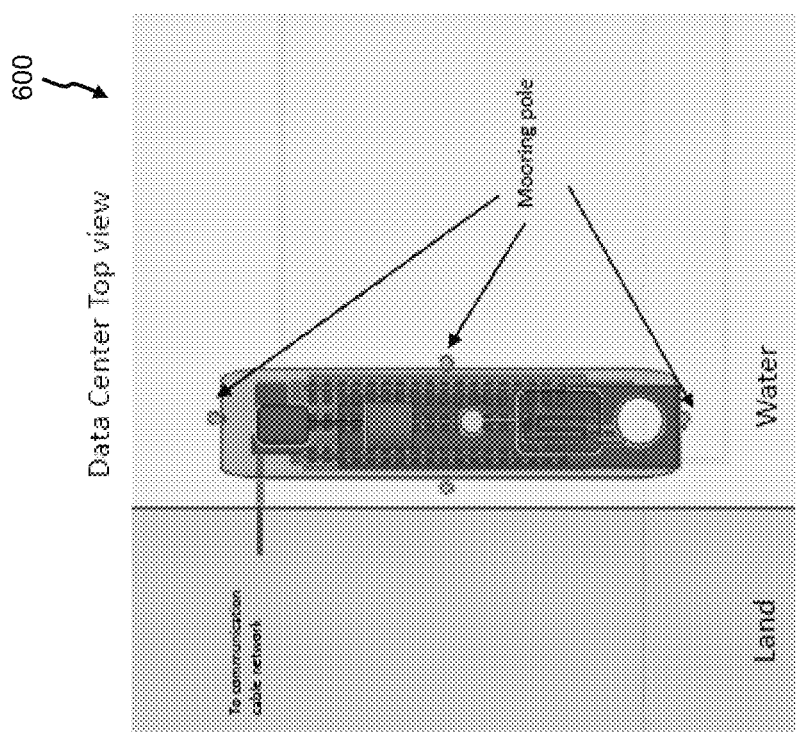
FIGS. 6a and 6b respectively show side view and top view of a configuration of a floating data centre implemented on a bottom sitting barge adapted for shallow water installation.
Figure 6A:
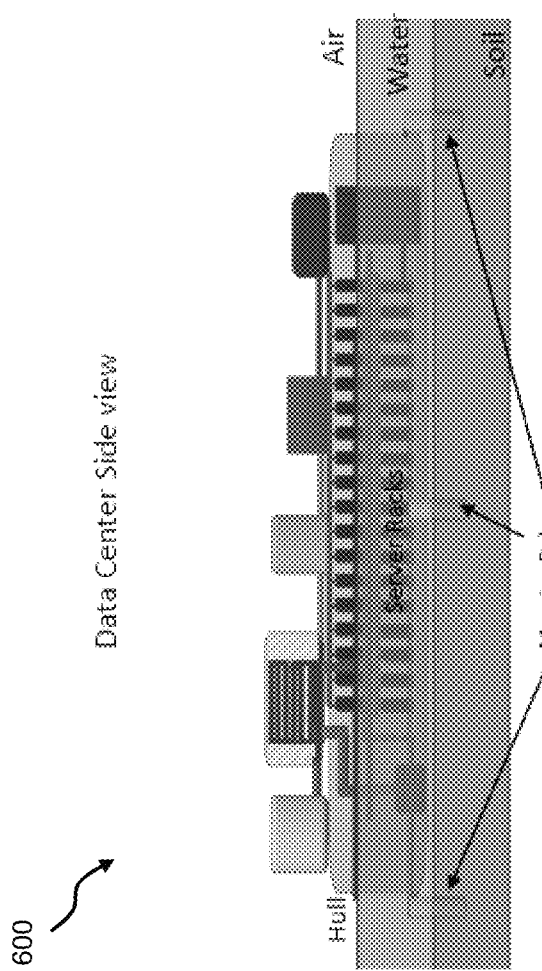
Figure 7B:
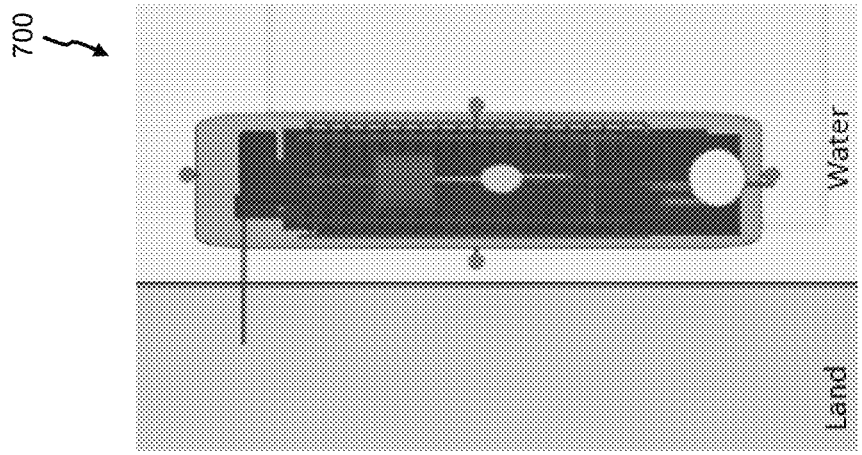
FIGS. 7a and 7b respectively show side view and top view of a configuration of a floating data centre implemented on a piled barge adapted for mid water installation.
Figure 7A:
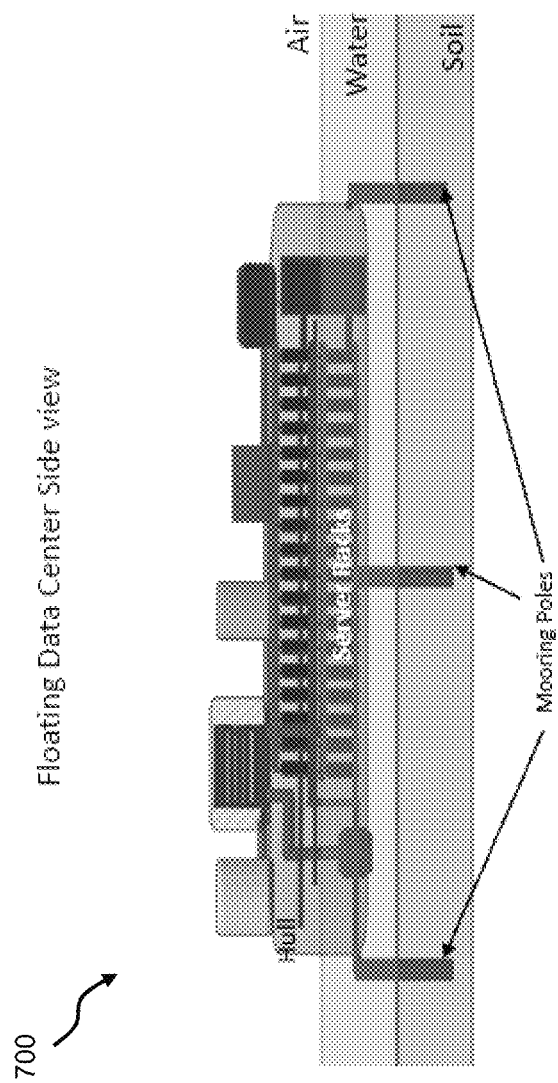
Figure 8:
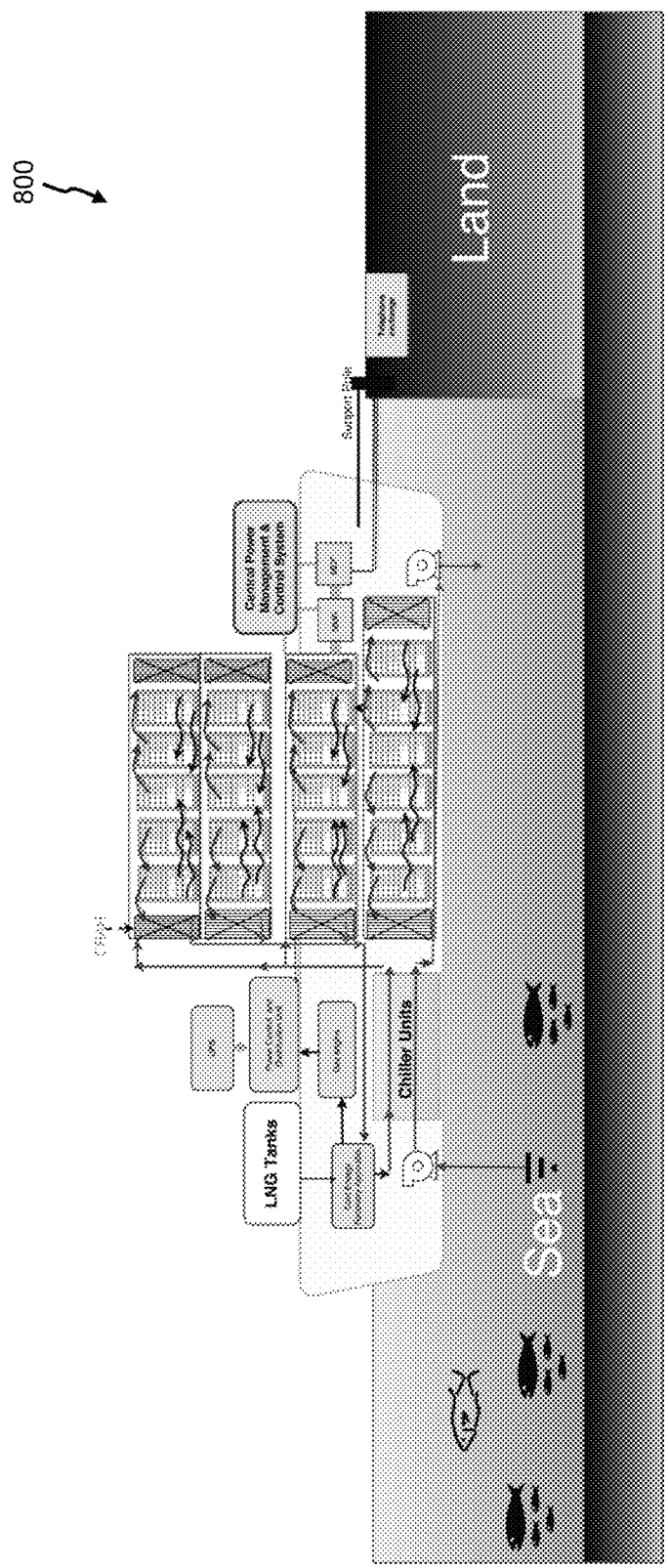

FIGS. 6a and 6b respectively show side view and top view of a configuration 600 of a floating data centre implemented on a bottom sitting barge adapted for shallow water installation (using mooring poles). In an alternative concept, FIGS. 7a and 7b respectively show side view and top view of a configuration 700 of a floating data centre implemented on a piled barge adapted for mid water installation (also using mooring poles). FIG. 8 shows a side view of a floating data centre 800, which uses the proposed apparatus 100.

Typically, during vaporization of LNG, the cold energy is lost to the atmosphere or the sea. In contrast, the proposed apparatus 100 is however able to beneficially recover the cold energy stored in the LNG by a coolant that may then be transferred for cooling systems applications, such as data centres which require continuous heat removal for smooth operations. The disclosed apparatus 100 minimizes cooling energy load imposed versus conventional solutions (e.g. electrical vapour compression chillers), and also improves power usage effectiveness of data centres significantly. Correspondingly, the proposed apparatus 100 is able to also reduce the overall power consumption of data centres and reduce emissions.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practicing the claimed invention. It is also to be appreciated that the inlet 104a and outlet 104b of the tank 102 may also be coupled to other systems cooling application,

The invention claimed is:

1. A self-powered data center comprising:
   a plurality of computing units;
   a plurality of air handling units configured to use chilled water to provide cooling to the computing units, in which the chilled water is converted to heated water during the cooling;
   a cold energy recovery apparatus comprising:
      a fluid storage tank having at least a pair of inlet and outlet, the inlet configured to receive the heated water from the plurality of air handling units; and
      a heat exchanger arranged in the fluid storage tank, the heat exchanger having an inlet and an outlet, the inlet configured to receive liquefied natural gas, wherein the cold energy recovery apparatus is operable to permit the heated water to flow from the inlet to the outlet of the fluid storage tank causing the heated water to be in fluid contact with the heat exchanger, in which the heated water is progressively cooled to a lower temperature by heat transfer to the liquefied natural gas via fluid contact with the heat exchanger; and
   wherein the liquefied natural gas is vaporized into natural gas due to the heat transfer and is directed out from the outlet of the heat exchanger;
   a plurality of liquefied natural gas tanks coupled to the cold energy recovery apparatus to provide liquefied natural gas thereto for cooling the heated water;
   a plurality of vapor compression chillers configured to receive the cooled water from the cold energy recovery apparatus and to further cool the cooled water using seawater to produce the chilled water for provision to the air handling units;
   a plurality of vapor absorption chillers configured to use waste heat energy and seawater to produce the chilled water for provision to the air handling units;
   a plurality of gas engine generators configured to receive natural gas from the cold energy recovery apparatus for power generation, the power generated provided to operate the computing units and/or associated components inside the data center;
   a plurality of waste heat recovery units coupled to the natural gas engine generators to recover waste heat energy generated by the gas engine generators during power generation, the waste heat energy provided to the vapor absorption chillers; and
   an integrated power and water management system configured to be electrically coupled to the vapor compression chillers, the vapor absorption chillers, the gas engine generators, and the computing units to enable power and cooling management thereof.

2. The self-powered data center of claim 1, wherein the data center is a floating data center configured to have buoyancy capabilities.

3. The self-powered data center of claim 2, wherein the data center is arranged on a vessel or positioned proximate a body of water.

4. The self-powered data center of claim 2, wherein the floating data center is arranged on a floating unit.

5. A method of cooling a coolant using a cold energy recovery apparatus for a self-powered data, center the cold energy recovery apparatus includes a fluid storage tank having at least a pair of inlet and outlet, and a heat exchanger arranged in the fluid storage tank, the heat exchanger having an inlet and an outlet, the method comprising:
   using chilled coolant, wherein the chilled coolant is chilled water from an air handling unit, to provide cooling to at least one computing unit in the data center, in which the chilled water is converted to heated water during the cooling;
   cooling the heated water in the cold energy apparatus, wherein the cooling comprises:
   receiving the heated water from the inlet of the fluid storage tank; and
   receiving liquefied natural gas from the inlet of the heat exchanger,
   allowing the heated water to flow from the inlet to the outlet of the fluid storage tank causing the heated water to be in fluid contact with the heat exchanger, in which the heated water is progressively cooled to a lower temperature by heat transfer to the liquefied natural gas via fluid contact with the heat exchanger; and
   subjecting the cooled water from the cold energy apparatus to further cooling in at least one vapor compression chiller using seawater to produce chilled water for provision to the air handling unit for cooling the at least one computing unit in the data center.

\* \* \* \* \*